(12) United States Patent
Mortazavi et al.

(10) Patent No.: US 9,209,762 B1
(45) Date of Patent: Dec. 8, 2015

(54) SWITCHING POWER AMPLIFIER WITH RATE-CONTROLLED POWER SUPPLY VOLTAGE TRANSITIONS

(71) Applicant: Cirrus Logic, Inc., Austin, TX (US)

(72) Inventors: Yousof Mortazavi, Austin, TX (US); Arash Mashayekhi, Austin, TX (US); Mohammad Ranjbar, San Jose, CA (US)

(73) Assignee: CIRRUS LOGIC, INC., Austin, TX (US)

( * ) Notice: Subject to any disclaimer, the term of this patent is extended or adjusted under 35 U.S.C. 154(b) by 51 days.

(21) Appl. No.: 14/061,912

(22) Filed: Oct. 24, 2013

Related U.S. Application Data (60) Provisional application No. 61/807,148, filed on Apr. 1, 2013.

(51) Int. Cl.
  *H03F 3/217* (2006.01)
  *H03F 3/185* (2006.01)

(52) U.S. Cl.
  CPC .............. *H03F 3/217* (2013.01); *H03F 3/185* (2013.01); *H03F 3/2171* (2013.01)

(58) Field of Classification Search
  CPC ....... H03F 3/217; H03F 3/2171; H03F 3/185; H03G 3/10
  USPC .................. 330/10, 207 A, 251; 381/104
  See application file for complete search history.

(56) References Cited

U.S. PATENT DOCUMENTS

| | | | |
|---|---|---|---|
| 5,898,340 A * | 4/1999 | Chatterjee et al. | 330/251 |
| 6,344,811 B1 * | 2/2002 | Melanson | 341/143 |
| 6,472,935 B2 | 10/2002 | King et al. | |
| 6,501,331 B2 | 12/2002 | Adar | |
| 6,538,590 B1 | 3/2003 | Gaboriau et al. | |
| 6,917,504 B2 | 7/2005 | Nguyen et al. | |
| 7,078,963 B1 | 7/2006 | Andersen et al. | |
| 7,166,992 B2 | 1/2007 | Kudo et al. | |
| 7,224,218 B1 | 5/2007 | Jiang et al. | |
| 7,259,619 B2 | 8/2007 | Chang et al. | |
| 7,312,654 B2 | 12/2007 | Roeckner et al. | |

(Continued)

FOREIGN PATENT DOCUMENTS

| | | |
|---|---|---|
| WO | WO 0215386 A2 | 2/2002 |

OTHER PUBLICATIONS

U.S. Appl. No. 14/176,681, filed Feb. 10, 2014, Naraghi, et al.

*Primary Examiner* — Steven J Mottola
*Assistant Examiner* — Hafizur Rahman
(74) *Attorney, Agent, or Firm* — Mitch Harris, Atty at Law, LLC; Andrew M. Harris (57) ABSTRACT

In a switched-power amplifier that has controlled power supply rails, e.g., when a volume control is implemented by varying the power supply voltages, a rate-controlled power supply control circuit eliminates audible pops that would otherwise occur when a change in input level causes the power supply rail voltages to change. The control circuit generates control signals that control the regulators providing the power supply rails with a controlled rate of change such that asymmetry between the voltages of the power supply rail outputs during changes of the power supply rails is substantially reduced. The controlled rate of change is less than or equal to the slowest rate of change of the power supply outputs that supply the power supply rails of the switched-power amplifier.

20 Claims, 4 Drawing Sheets

(56) References Cited

U.S. PATENT DOCUMENTS

| | | |
|---|---|---|
| 7,554,399 B1 | 6/2009 | Gaboriau et al. |
| 7,554,409 B1 | 6/2009 | Zhang et al. |
| 7,570,118 B1 | 8/2009 | Gaboriau et al. |
| 7,777,563 B2 | 8/2010 | Midya et al. |
| 7,782,138 B2 | 8/2010 | Dally et al. |
| 7,990,212 B1 | 8/2011 | Tsang |
| 8,249,275 B1 | 8/2012 | Tsang et al. |
| 8,410,855 B2 * | 4/2013 | Kim et al. ............... 330/297 |
| 8,841,894 B1 | 9/2014 | Naraghi et al. |
| 2010/0270989 A1 | 10/2010 | Sasaki et al. |
| 2011/0187339 A1 | 8/2011 | Trattler et al. |
| 2012/0139357 A1 * | 6/2012 | Teggatz et al. ............. 307/104 |
| 2012/0262232 A1 * | 10/2012 | Sukegawa et al. ............ 330/127 |

* cited by examiner

SWITCHING POWER AMPLIFIER WITH RATE-CONTROLLED POWER SUPPLY VOLTAGE TRANSITIONS

This U.S. Patent Application claims priority under 35 U.S.C. §119(e) to U.S. Provisional Patent Application Ser. Patent Application Ser. No. 61/807,148 filed on Apr. 1, 2013.

FIELD OF THE INVENTION

The present invention relates generally to control of switched-power amplifier power supply voltages, and more specifically, to techniques for preventing asymmetry due to differences in slew rate of outputs of the power supplies providing the power supply voltages to a switched-power output stage.

BACKGROUND OF THE INVENTION

Switched-power amplifiers, also referred to as Class-D amplifiers, are in common use in audio applications due to their efficiency and compact size compared to traditional analog (linear) power amplifiers. The efficiency and/or noise performance of switched-power amplifiers can be further improved by reducing the power supply voltage provided to the switched-power output stage when the signal level being reproduced is low in amplitude. One manner in which the power supply voltage may be controlled uses a volume control value to adjust the power supply rails. Other schemes determine the signal amplitude after any volume control value has been applied and adjust the power supply rail voltages according to the expected output signal level.

In audio applications, the supply rail(s) of a class-D amplifier may be chosen from a set of discrete voltages in order to implement a digital volume control scheme. In such a scheme, a reference generator circuit typically selects one of a number of discrete voltage levels depending on the digital volume control level. The power supply rail voltage is generated in conformity with the volume control level. For example, a reference voltage generated by the reference generator may be buffered by a low dropout regulator (LDO) and applied as a power supply rail of the switched-power output stage. By changing the supply rail(s) of the amplifier in conformity with the digital volume control level, the output power is modulated.

When the power supply rail voltage changes between two discrete levels of amplifier supply rail(s), audible pops/clicks and or wideband spectral leakage can occur. The pops are typically not tolerable and must be prevented. Typically, the pops are prevented by increasing the number of steps and only stepping between adjacent levels until the desired volume change is achieved. However, the number of discrete levels required to ensure that all of the steps are inaudible may grow prohibitively large due to the increased area, cost, and complexity.

Therefore, it would be desirable to provide techniques for controlling the power supply rail voltage of a switched-power amplifier without requiring a prohibitively large number of discrete power supply output voltages.

SUMMARY OF THE INVENTION

The above-stated objective of controlling switched-power amplifier power supply rails without generating output transients is accomplished in a circuit and method. The method is a method of operation of the circuit.

The circuit includes a controllable power supply with symmetric rail outputs, in which the output voltages are controlled in response to a power supply control input signal. The circuit also includes a switching circuit coupled to the symmetric rail outputs and a switching control circuit that receives an input signal and generates switching control signals for controlling the switching circuit. The circuit also includes a power supply control circuit that generates the power supply control input signal in conformity with an output level control signal by controlling a rate of change between adjacent steps in the output level control signal. The rate of change is controlled so that asymmetry between the voltages of the power supply rail outputs during changes of the output level control signal is substantially reduced by the controlled rate of change being less than or equal to a rate of change of the slowest response of the power supply rail outputs.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The techniques disclosed herein provide for elimination or reduction of audible artifacts that occur in the audio output of switched power amplifiers, e.g., Class-D amplifiers, when the power supply rail voltages are changed dynamically. The power supply rail voltages are generally changed in order to provide volume control, or in response to a control signal, that may, for example, set the power supply rail voltage in conformity with a detected signal level to improve the efficiency of and/or reduce noise of the amplifier at low signal levels.

In a class-D audio amplifier or other switched-power output circuit having controllable power supply rail voltages, the output voltage (or power) is modulated by adjusting the voltage of the supply rail(s) of the amplifier. Then the voltages of the power supply rails is changed, transient behavior can cause undesirable effects. In audio amplifiers, this may result in pops, clicks or other audible artifacts (also known as "zipper noise"). In telecommunications or RF applications, output transients may cause spectral leakage and increase out-of-band emissions during power-level changes.

The techniques and circuits disclosed herein reduce or eliminate zipper noise due to power supply rail voltage changes by controlling the transient profile of the power supply rail voltages during the power supply rail voltage change. While the circuits described herein are audio amplifier circuits, the techniques disclosed herein can be applied to other switched-power circuits, such as telecommunications or radio-frequency (RF) power amplifiers and modulators where supply rails are adjusted to adjust output power or to amplitude-modulate a signal.

In DC coupled class-D amplifiers (or ground centered class-D amplifiers), e.g. where one rail is the negative of the other, there is no DC blocking capacitor between amplifier and load. To avoid audible pops/clicks when the power supply rail voltage is changed, the changes should be synchronized and the transient should be controlled in such a way that the average of the two rails remains substantially constant (typically 0V or more generally the DC level of the amplifier output), so that a DC shift in the amplifier output voltage does not occur.

Difficulty arises when the circuits that supply the positive and negative power supply rail voltages are inherently different circuits, such as positive and negative low-dropout regulators (LDOs). For example, if the LDO supplying the positive power supply rail has a faster response than the LDO supplying the negative power supply rail, the instantaneous average of the two power supply rail voltages is not a constant, but is a transient waveform. As a result, pops/clicks may be heard. A transient difference of a few millivolts may be sufficient to generate an audible pop in the output of audio amplifiers. The present disclosure provides techniques and circuits for ensuring that the power supply rail voltages maintain symmetry during changes in voltage.

Figure 1:
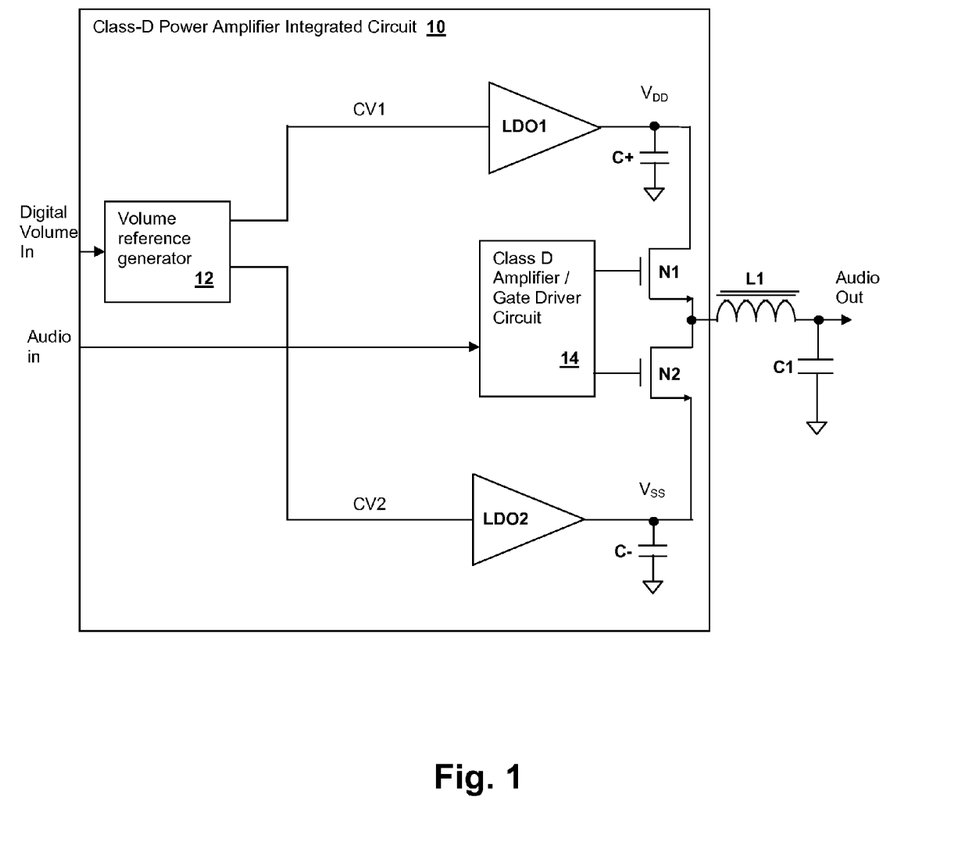
FIG. 1 is a simplified schematic diagram depicting a switched-power audio amplifier circuit.

Referring now to FIG. 1, an example audio integrated circuit 10 that implements techniques for maintaining power supply rail voltage symmetry is shown. Integrated circuit 10 implements a switched-power amplifier stage that receives an output level control signal Digital Volume In and an analog audio input signal Audio In. While the circuit illustrated herein receives an analog input signal, alternatively, using conversion circuits, or a change in implementation of the internal circuits, either of the volume control input and/or audio signal input may be provided as analog or digital signals. Alternatively, in implementations in which signal amplitude detection is used to control the power supply rail voltage, the volume control value may be replaced with the output of a signal level detector.

Within class-D power amplifier integrated circuit 10, a Class D Amplifier/Gate driver circuit 14 receives audio input signal Audio In and provides pulse-width modulated output gate control signals to the gates of switching transistors N1 and N2. Switching transistors N1 and N2 alternatively conduct to generate an output signal that is filtered by an inductor L1 and a capacitor C1, to provide a power audio output signal Audio Out. Power supply rail voltages $V_{DD}$ and $V_{SS}$ are provided to switching transistors N1 and N2 from the outputs of low-dropout regulators (LDOs) LDO1 and LDO2, respectively. In order to provide volume control in class-D power amplifier integrated circuit 10, the power supply rail voltages are varied by changing power supply control input signals CV1 and CV2 provided to reference voltage inputs of LDOs LDO1 and LDO2, which improves performance of class-D power amplifier integrated circuit 10. By providing volume control by adjusting the power supply rail voltages, the dynamic range of the modulator within class-D power amplifier integrated circuit 10 need be scaled only to audio input signal Audio In and thus does not have to handle additional dynamic range due to volume control.

Power supply rail voltages $V_{DD}$ and $V_{SS}$ are filtered by capacitors C+ and C−, respectively, to remove ripple and noise that could otherwise appear in power audio output signal Audio Out. However, in order to maintain compact size, reduce cost and provide for sufficiently rapid response of the power supply rail voltages to volume changes, capacitors C+ and C− are relatively small in capacitance, so that the maximum rate of change of power supply rail voltages $V_{DD}$ and $V_{SS}$ is primarily determined by the step response of LDOs LDO1 and LDO2. The step response of LDOs LDO1 and LDO2 will typically be quite different and will vary based on on-resistance (or R for bipolar LDO implementations), which also varies with temperature. In order to provide a symmetric response of power supply rail voltages $V_{DD}$ and $V_{SS}$ when steps occur in output level control signal Digital Volume In, a volume reference generator 12 generates power supply control input signals CV1 and CV2 to have a fixed response rate during transitions due to the steps. The fixed response rate is determined such that the rate of change or power supply control input signals CV1 and CV2 does not exceed the maximum slew rate of the step response of the slowest of the outputs of LDOs LDO1 and LDO2, including the maximum tolerance value of capacitors C+ and C−. Therefore, volume reference generator 12 will dictate the rate of change of both power supply rail voltages $V_{DD}$ and $V_{SS}$ by setting the rate of change of power supply control input signals CV1 and CV2, rather than power supply rail voltages $V_{DD}$ and $V_{SS}$ being slew rate limited due to the response of LDOs LDO1 and LDO2. In some implementations, only one power supply control input signal may be present, as LDOs LDO1 and LDO2 might be controlled by a single digital or analog value in other designs.

Figure 2A:
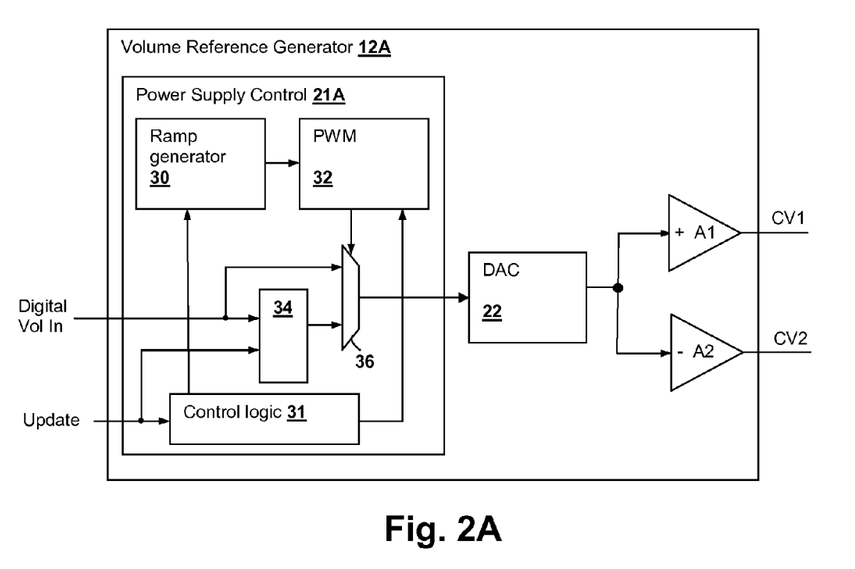
FIG. 2A is a block diagram depicting an example of a volume reference generator circuit that may be used to implement volume reference generator 12 of integrated circuit 10 in FIG. 1.

Referring now to FIG. 2A, a control circuit 12A that may be used to implement volume reference generator 12 of FIG. 1, is shown. Volume reference generator 12 includes a power supply control circuit 21A that receives output level control signal Digital Volume In and another control signal Update that indicates when output level control signal Digital Volume In has changed. Power supply control circuit 21A includes a ramp generator 30 that controls the profile of changes in power supply control input signals CV1 and CV2 when triggered by control logic 31 in response to assertion of control signal Update. Control signal Update also latches the previous value of output level control signal Digital Volume In into a latch 34 when control signal Update is de-asserted. A pulse-width modulator (PWM) 32 receives the output of ramp generator 30, and selects between the previous value of output level control signal Digital Volume In stored in latch 34 and output level control signal Digital Volume In, which now has a new value provided in conjunction with a trailing edge of control signal Update. PWM 32 performs the selection of the gain values applied to the audio signal by operating the control input to a multiplexer 36 with a PWM signal having proportions described above that are determined by the current value of the output of ramp generator 30. The one-shot gain control profile generated by ramp generator may be linear, or may assume a non-linear shape tailored to further reduce audio artifacts. Once the ramp has completed the transition, the output of PWM 32 will remain in the state that selects output level control signal Digital Volume In onto the output of multiplexer 36. The output of multiplexer 36 is provided to a digital-to-analog converter (DAC) 22 that generates a voltage provided to the inputs of amplifiers A1 and A2 to generate power supply control input signals CV1 and CV2 corresponding to the value at the output of multiplexer 36, which is changing dynamically during transitions between steps of output level control signal Digital Volume In. Since power supply control input signals CV1 and CV2 have a ramp waveform (or other monotonically-increasing waveshape that does not exceed the slew rate, or slope of the step response of the power supply circuit), power supply rail voltages $V_{DD}$ and $V_{SS}$ will have substantially identical waveshapes. The waveshapes are identical, except for being inverts of each other, since the step response of both power supply rail voltages $V_{DD}$ and $V_{SS}$ is guaranteed to be fast enough to reproduce the shape of power supply control input signals CV1 and CV2 without distortion. The outputs of amplifiers A1 and A2 are not filtered, since the response of LDO1 and LDO2 including capacitors C+ and C− will filter out components at and above the sampling rate of PWM 32.

Figure 2B:
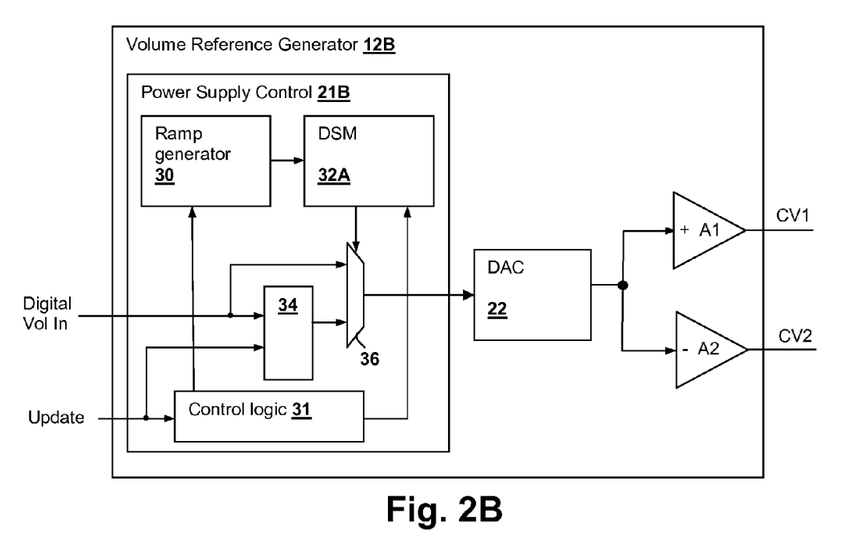
FIG. 2B is a block diagram depicting another example of a volume reference generator circuit that may be used to implement volume reference generator 12 of integrated circuit 10 in FIG. 1.

Referring now to FIG. 2B, a volume reference generator circuit 12B that may be used to implement volume reference generator 12 of FIG. 1, is shown. Volume reference generator 12B includes a power supply control circuit 21B that receives output level control signal Digital Volume In and control signal Update as described above with respect to volume reference generator 12A of FIG. 2A, and is substantially similar in operation thereto. Therefore, only differences between power supply control circuit 21B and power supply control circuit 21A of FIG. 2A will be described below. In contrast to volume reference generator 12A of FIG. 2A, volume reference generator 12B includes a type of modulator other than the pulse-width modulator described above, such as a delta-sigma modulator (DSM) 32A, that spreads any audio components due to the ramp shape of transitions in the power supply rail voltages across their frequency band, reducing the audibility of any tone that could otherwise occur during the change in power supply rail voltages $V_{DD}$ and $V_{SS}$. As in the volume reference generator 12A of FIG. 2A, digital-to-analog converter (DAC) 22 generates a voltage provided to the inputs of amplifiers A1 and A2, which then generate power supply control input signals CV1 and CV2. The output of amplifiers A1 and A2 is not filtered, since the response of LDO1 and LDO2 including capacitors C+ and C− will filter out components at and above the sampling rate of DSM 32A. As in volume reference generator 12A of FIG. 2A, the resulting effect of power supply control input signals CV1 and CV2 is to impose a ramp (or other) shape on power supply rail voltages $V_{DD}$ and $V_{SS}$, as the in-band components of power supply control input signals CV1 and CV2 that are not filtered by the response of LDO1 and LDO2 including capacitors C+ and C− is that of the output of ramp generator 20. As in volume reference generator 12A of FIG. 2A, the step response of both power supply rail voltages $V_{DD}$ and $V_{SS}$ is guaranteed to be fast enough to reproduce the shape of the (low-frequency) ramp component of power supply control input signals CV1 and CV2 with little or no distortion.

Figure 3A:
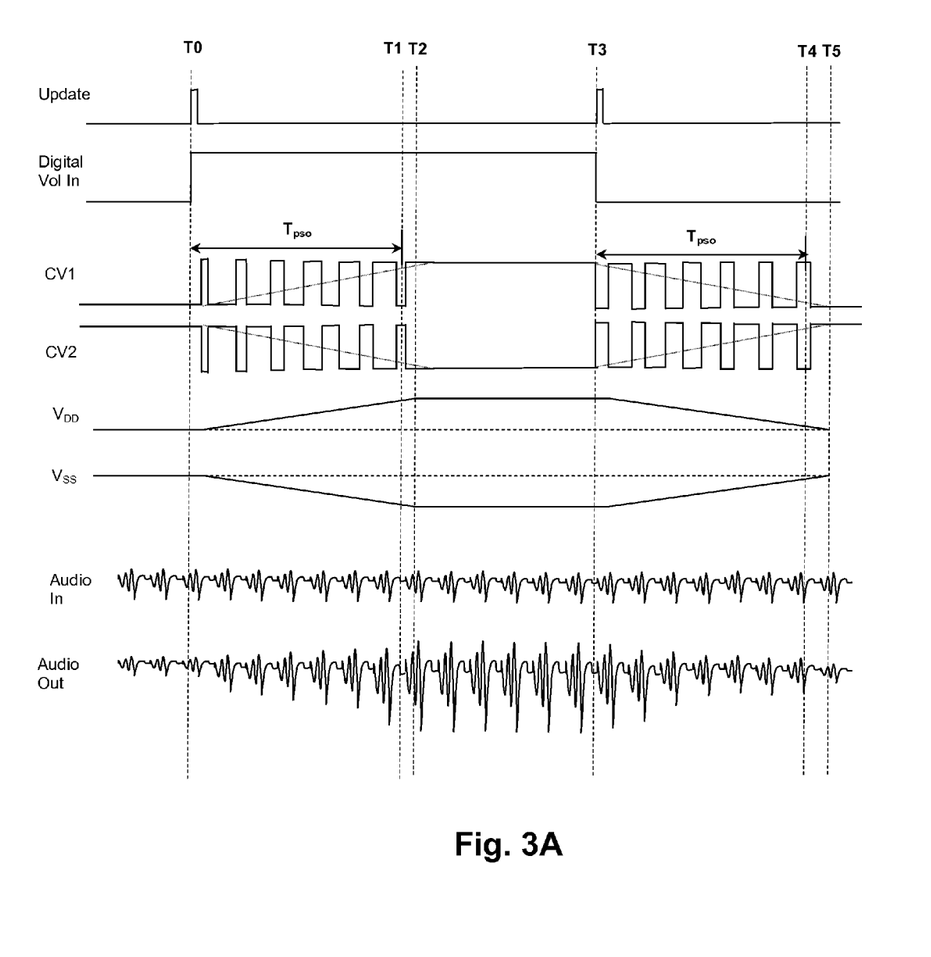
FIG. 3A is a signal waveform diagram illustrating operation of audio integrated circuit 10 of FIG. 1 including volume reference generator circuit 12A of FIG. 2A.

Referring now to FIG. 3A, signal waveforms illustrating operation of audio integrated circuit 10 of FIG. 1, is shown, including volume reference generator circuit 12A of FIG. 2A. As illustrated, at time T0, control signal Update is pulsed and output level control signal Digital Volume In changes by a step, which in the example can be understood to correspond to a least-significant bit, but is not restricted to a single step. Between times T0 and T1, the pulse width of power supply control input signals CV1 and CV2 increases according to a ramp, and continue to increase until time T2. Time interval $T_{PSO}$, which represents the interval of time between times T0 and T1, represents the longest settling time as between power supply rail voltages $V_{DD}$ and $V_{SS}$. As can be seen from the figure, the duration of the ramp portion of power supply rail voltages $V_{DD}$ and $V_{SS}$ due to the pulse width of power supply control input signals CV1 and CV2 extends beyond time interval $T_{PSO}$, i.e., from time T0 to time T2. Due to the controlled rate of change, the change in power supply control input signals CV1 and CV2 continues beyond time T1 to extend beyond a full time interval $T_{PSO}$. The resulting action ensures that the shape of the waveforms of power supply rail voltages $V_{DD}$ and $V_{SS}$ is substantially symmetric so that no net DC transient is generated on output signal Audio Out, which has a gain relationship over audio input signal Audio In that is determined by output level control signal Digital Volume In, as illustrated in the Figure. At time T3, control signal Update is pulsed and output level control signal Digital Volume In changes back by a step. Again, the duration of the ramp portion of power supply rail voltages $V_{DD}$ and $V_{SS}$ due to the pulse width of power supply control input signals CV1 and CV2 extends beyond time interval $T_{PSO}$, i.e., from time T3 to time T5. Due to the controlled rate of change, the change in power supply control input signals CV1 and CV2 continues beyond time T5 to extend beyond a full time interval $T_{PSO}$.

Figure 3B:
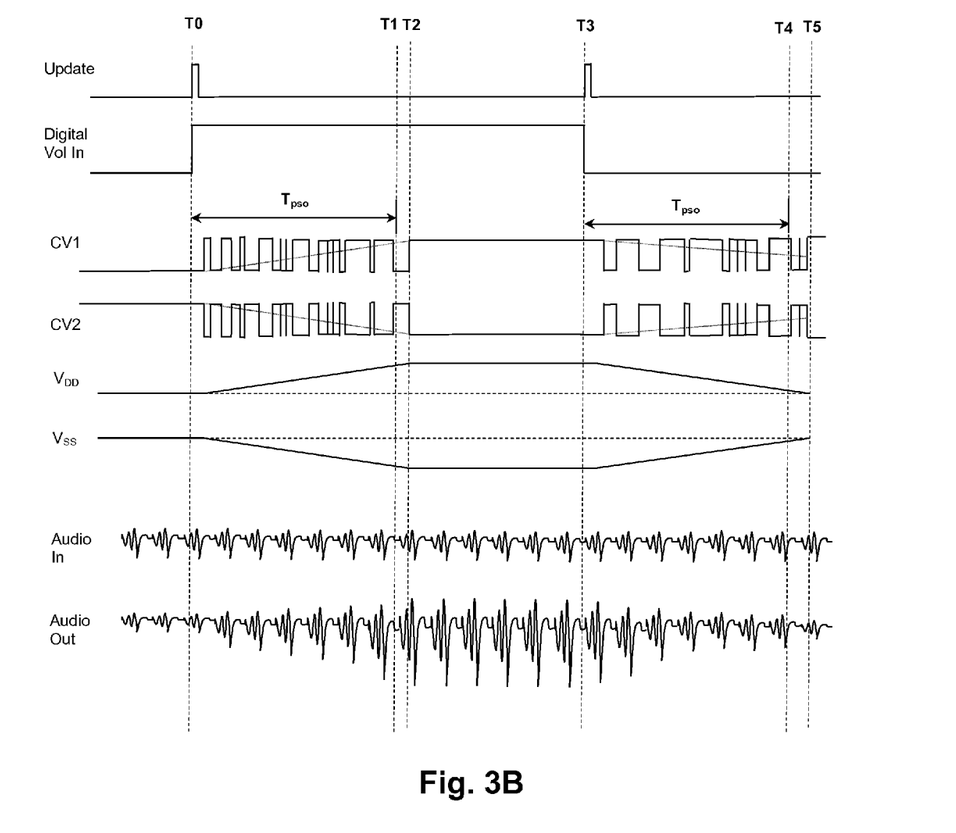
FIG. 3B is a signal waveform diagram illustrating operation of audio integrated circuit 10 of FIG. 1 including volume reference generator circuit 12B of FIG. 2B.

Referring now to FIG. 3B, signal waveforms illustrating operation of audio integrated circuit 10 of FIG. 1, is shown, including volume reference generator circuit 12B of FIG. 2B. FIG. 3B is similar to FIG. 3A, so only differences between them will be described below. Instead of pulse-width modulated signals provided for power supply control input signals CV1 and CV2, the waveforms of power supply control input signals CV1 and CV2 are delta-sigma modulated. Due to the low-pass response of LDO1 and LDO2 including capacitors C+ and C−, the generated waveforms of power supply rail voltages $V_{DD}$ and $V_{SS}$ are identical to that of FIG. 3A, although any residual high frequency components that remain will be noise-shaped to spread their spectrum more evenly than would be provided by the ramp waveform of FIG. 3A.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. A circuit for generating an output signal of varying amplitude, the circuit comprising:

a first low-dropout linear regulator for generating a positive power supply rail output and having a first reference voltage input;

a second low-dropout linear regulator for generating a negative power supply rail output and having a second reference voltage input, wherein a first response of the positive power supply rail output differs from a second response of the negative power supply rail output;

a switching circuit having a first power supply rail input coupled to the positive power supply rail output of the first low-dropout linear regulator and a second power supply rail input coupled to the negative power supply rail output of the second low-dropout linear regulator;

a switching control circuit having an input for receiving an input signal and generating switching control signals for controlling the switching circuit, wherein the switching control circuit comprises a modulator for generating the switching control signals in conformity with a value of the input signal; and a power supply control circuit having an input for receiving at least one output level control signal and generating at least one power supply control signal supplied to the first reference voltage input of the first low-dropout linear regulator and the second reference voltage input of the second low-dropout linear regulator, wherein the power supply control circuit generates the power supply control signal in conformity with the at least one output level control signal with a controlled rate of change between adjacent steps in the at least one output level control signal, such that asymmetry between the voltages of the positive power supply rail output of the first low-dropout linear regulator and the negative power supply rail output of the second low-dropout linear regulator during changes of the at least one output level control signal is substantially reduced by the controlled rate of change being less than or equal to rates of change of both the first response and the second response such that waveforms of the voltages of the positive power supply output and the negative power supply output are substantially symmetrical when the at least one output level control signal changes.

2. The circuit of claim 1, wherein the first response is a voltage step response of the positive power supply rail output with respect to the at least one output level control signal, and wherein the second response is a voltage step response of the negative power supply rail output with respect to the at least one output level control signal.

3. The circuit of claim 1, wherein the output signal is an audio signal, and wherein the circuit is an audio power amplifier.

4. The circuit of claim 1, wherein the at least one power supply control input signal is a single power supply control input signal that has a controlled rate of change less than or equal to a lesser one of a first slew rate of the first response and a second slew rate of the second response.

5. The circuit of claim 1, wherein the at least one power supply control input signal is modulated to produce the controlled rate of change.

6. The circuit of claim 5, wherein the power supply control circuit includes a delta-sigma modulator for generating the at least one power supply control input signal.

7. The circuit of claim 5, wherein the controlled rate of change is constant, whereby the at least one power supply control input signal has a linear ramp waveshape.

8. A method of controlling a switched-power circuit that generates an output signal of varying amplitude, the method comprising:
   generating a pair of symmetric power supply rail outputs using low-dropout linear regulators that control voltages of their respective one of the symmetric power supply rail outputs in conformity with an output level control signal;
   controlling voltages of the symmetric power supply rail outputs in conformity with at least one power supply control input signal;
   generating the output signal by alternatively switching between the symmetric power supply rail outputs under control of a modulator that controls the switching in conformity with a value of an input signal; and
   generating the power supply control input signal in conformity with an output level control signal and with a controlled rate of change between adjacent steps in the output level control signal, so that asymmetry between the voltages of the power supply rail outputs during changes of the output level control signal is substantially reduced by the controlled rate of change being less than or equal to rates of change of responses of both of the power supply rail outputs, such that waveforms of the symmetric power supply rail outputs are substantially symmetrical when the output level control signal changes.

9. The method of claim 8, wherein the responses of the power supply rail outputs are voltage step responses with respect to the output level control signal.

10. The method of claim 8, wherein the output signal is an audio signal, and wherein the circuit is an audio power amplifier.

11. The method of claim 8, wherein the at least one power supply control input signal is a single power supply control input signal that has a controlled rate of change less than or equal to a lesser one of slew rates of the responses of the power supply rail outputs.

12. The method of claim 11, wherein the generating the at least one power supply control input signal modulates the output level control signal to produce the controlled rate of change.

13. The method of claim 12, wherein the generating the at least one power supply control input signal applies delta-sigma modulation to the output level control signal.

14. The method of claim 13, wherein the controlled rate of change is constant, whereby the generating the at least one power supply control input signal generates a linear ramp waveform.

15. A switched-power amplifier circuit, comprising:
   a switching output stage for generating an output signal by switching between two symmetric power supply rail voltages according to a modulated input signal;
   a pair of low-dropout linear regulators for generating the symmetric power supply rail voltages in conformity with at least one power supply control input signal; and
   a power supply control circuit having an input for receiving at least one output level control signal and supplying the at least one power supply control input signal to the controllable power supply, wherein the power supply control circuit generates the power supply control input in conformity with the at least one output level control signal with a controlled rate of change between adjacent steps in the at least one output level control signal, such that asymmetry between the voltages of the power supply rail outputs during changes of the at least one output level control signal is substantially reduced by the controlled rate of change being less than or equal to rates of change of both outputs of the pair of regulators, such that waveforms of the symmetric power supply rail voltages are substantially symmetrical when the output level control signal changes.

16. The circuit of claim 15, wherein the power supply control circuit includes a delta-sigma modulator for generating the at least one power supply control input signal.

17. A method of amplifying an input signal, the method comprising:
   switching between a pair of symmetric power supply rail outputs to generate an output signal;
   controlling voltages of the symmetric power supply rail outputs in conformity with at least one power supply control input signal using a pair of low-dropout linear regulators; and
   generating the power supply control input signal in conformity with an output level control signal and with a controlled rate of change between adjacent steps in the output level control signal, so that asymmetry between the voltages of the power supply rail outputs during changes of the output level control signal is substantially reduced by the controlled rate of change being less than or equal to rates of change of responses of both of the power supply rail outputs, such that waveforms of the symmetric power supply rail voltages are substantially symmetrical when the output level control signal changes.

18. The method of claim 17, wherein the generating the at least one power supply control input signal applies delta-sigma modulation to the output level control signal.

19. A circuit for generating an output signal of varying amplitude, the circuit comprising:

a controllable power supply having power supply rail outputs having symmetric voltages, wherein the voltages are controlled in response to a power supply control input signal, wherein the controllable power supply has a first response corresponding to a first one of the power supply rail outputs and a second response corresponding to a second one of the power supply rail outputs;

a switching circuit having first and second power supply rail inputs coupled to the power supply rail outputs of the controllable power supply;

a switching control circuit having an input for receiving an input signal and generating switching control signals for controlling the switching circuit, wherein the switching control circuit comprises a modulator for generating the switching control signals in conformity with a value of the input signal; and a power supply control circuit having an input for receiving at least one output level control signal and supplying the at least one power supply control input signal to the controllable power supply, wherein the power supply control circuit generates the power supply control input signal in conformity with the at least one output level control signal with a controlled rate of change between adjacent steps in the at least one output level control signal, wherein the controlled rate of change is less than or equal to a lesser one of a first slew rate of the first response and a second slew rate of the second response, such that asymmetry between the voltages of the power supply rail outputs during changes of the at least one output level control signal is substantially reduced by the controlled rate of change being less than or equal to rates of change of both the first response and the second response of the power supply rail outputs.

20. A method of controlling a switched-power circuit that generates an output signal of varying amplitude, the method comprising:

generating a pair of symmetric power supply rail outputs;

controlling voltages of the symmetric power supply rail outputs in conformity with a power supply control input signal;

generating the output signal by alternatively switching between the symmetric power supply rail outputs under control of a modulator that controls the switching in conformity with a value of an input signal; and generating the power supply control input signal in conformity with an output level control signal and with a controlled rate of change between adjacent steps in the output level control signal, wherein the controlled rate of change is less than or equal to a lesser one of slew rates of the responses of the power supply rail outputs, so that asymmetry between the voltages of the power supply rail outputs during changes of the output level control signal is substantially reduced by the controlled rate of change being less than or equal to rates of change of responses of both of the power supply rail outputs.

* * * * *